United States Patent [19]
Chang et al.

[11] Patent Number: 5,691,956
[45] Date of Patent: Nov. 25, 1997

[54] MEMORY WITH FAST DECODING

[76] Inventors: Edward C. M. Chang; Deirdre S. Chang; Derek S. Chang, all of 863 26th Ave., San Francisco, Calif. 94121

[21] Appl. No.: 682,344

[22] Filed: Jul. 17, 1996

[51] Int. Cl.[6] ................................................. G11C 8/00
[52] U.S. Cl. .................... 365/239; 365/239; 365/230.09; 365/230.06
[58] Field of Search ................. 365/230.09, 230.06, 365/239, 221

[56] References Cited

U.S. PATENT DOCUMENTS

| | | | |
|---|---|---|---|
| 5,311,468 | 5/1994 | Anderson | 365/221 |
| 5,383,160 | 1/1995 | Furuyama | 365/221 |
| 5,566,124 | 10/1996 | Fudeyasu et al. | 365/221 |
| 5,566,371 | 10/1996 | Ogawa | 365/221 |

*Primary Examiner*—David C. Nelms
*Assistant Examiner*—Michael T. Tran
*Attorney, Agent, or Firm*—Skjerven, Morrill, MacPherson, Franklin & Friel LLP; Ronald J. Meetin

[57] ABSTRACT

A set of techniques are disclosed for organizing an electronic memory to increase the effective decoding speed while being able to randomly address storage locations in the memory. The memory typically contains a memory array (41 or 51) and address circuitry (40 or 50). In one memory-organization technique, the address circuitry contains a group of decoding segments ($50_1$–$50_M$) arranged in series. Each decoding segment partially decodes an input memory address. In another memory-organization technique, the address circuitry contains a plurality of decoding segments ($40_1$ and $40_2$) arranged in parallel, each decoding segment sequentially decoding different ones of the input memory addresses than each other decoding segment. A variation of the parallel memory-organization technique can be used with off-the-shelf memories.

24 Claims, 9 Drawing Sheets

MEMORY WITH FAST DECODING

FIELD OF USE

This invention relates to electronic memories, particularly semiconductor memories.

BACKGROUND ART

An electronic memory is a device that stores information in storage locations formed with memory cells. The memory cells are typically arranged in an array of rows and columns. After information has been written into the memory, the information is retained in the storage locations for later retrieval.

FIG. 1 illustrates the basic organization of a conventional memory device 10 of the semiconductor type. Memory device 10 consists of address decoder 11, memory array 12, and read/write circuitry 14. Memory 10 is addressed by input memory address signal A consisting, for example, of n bits supplied in parallel. Input memory address signal A provides memory address values in a compressed format and needs to be decoded in order to identify particular storage locations in memory array 12. Decoder 11 performs the decoding to produce decoded memory address signal B supplied directly to memory array 12. When array 12 is addressed by decoded memory address signal B, memory data DM moves between read/write circuitry 14 and array 12.

Read/write circuitry 14 consists of input/output ("I/O") control circuit 16, data-in buffer 17, data-out buffer 18, and read/write control logic 19 arranged as shown in FIG. 1. Data-in buffer 17 provides memory 10 with an input port. Data-out buffer 18 provides memory 10 with an output port. Buffers 17 and 18 are often merged together to provide a single I/O port.

In response to control signals C, here consisting of chip select signal CS, write enable signal WE, and output enable signal OE, read/write control logic 19 generates control logic signals CL, enable write signal EW, and enable read signal ER. These signals are respectively supplied to I/O control circuit 16, data-in buffer 17, and data-out buffer 18.

A memory write operation is performed by adjusting signals CS, WE, and OE so that enable signals EW and ER are respectively at enabling and disabling values. Data-in buffer 17 is thereby enabled, while data-out buffer 18 is disabled. Data D in the form of write (input) data DW then passes through data-in buffer 17 and I/O control circuit 16 to become memory data DM which is written into memory array 12 at the storage locations addressed through decoder 11 by input address signal A.

A memory read operation is performed by adjusting signals CS, WE, and OE so that enable signals EW and ER are respectively at disabling and enabling values. Consequently, data-in buffer 17 is disabled, while data-out buffer 18 is enabled. Memory data DM is then read out of the memory storage locations addressed through decoder 11 by address signal A and passes through I/O control circuit 16 and data-out buffer 18 to become data D in the form of read (output) data DR.

The number of storage locations that can be addressed by input address signal A depends on how many bits n are contained in signal A—i.e., the number of addressable storage locations increases as n increases. Ten input address bits are typically needed to address 1024 storage locations. Twenty input address bits are typically required for 1,048,576 storage locations.

As FIG. 1 indicates, the bits in input address signal A have to be decoded by decoder 11 in order to access the storage locations in memory array 12. The time needed to decode the input address bits dominates the time required to access memory 10. As the memory capacity increases thereby necessitating an increase in the number of input address bits, the memory access time increases. In electronic circuits that use large semiconductor memories, the speed at which the circuits can perform operations is often limited by the memory access time. As a result, considerable investigation has been performed into techniques for actually or effectively reducing the memory access time.

One way of effectively reducing memory access time is to use a memory interleave technique in which two or more separate memory devices are addressed in parallel. FIG. 2 depicts a semiconductor memory system that utilizes a two-way memory interleave technique. The interleaved memory system of FIG. 2 consists of address counter 20, holding register 21, a pair of memory devices $10_1$ and $10_2$, a corresponding pair of output registers $23_1$ and $23_2$, output multiplexer ("MUX") 24, delay registers 25 and 26, and divide-by-two circuit 28. Waveforms representing idealized time variations for certain of the signals present in the memory system of FIG. 2 are shown in FIG. 3.

Initial memory address signal AI having an even-numbered value k is supplied to address counter 20. Responsive to input clock signal CK, address counter 20 sequentially generates input memory address signal A at values k, k+1, k+2, k+3, and so on. Each n-bit value of input address signal A is sequentially loaded into holding register 21 also controlled by input clock CK. In response, holding register 21 sequentially provides further n-bit address signal H at values k, k+1, k+2, k+3, and so on.

Address signal H consists of n address bits $H_0$, $H_1$, $H_2$, . . . and $H_{n-1}$. All of the bits in address signal H except for least significant bit ("LSB") $H_0$ are used to address each of memory devices $10_1$ and $10_2$, causing memory data $DM_1$ and $DM_2$ to be read out of devices $10_1$ and $10_2$ at the addressed storage locations. Memory device $10_1$ has storage locations identified by odd-numbered addresses. Memory device $10_2$ has storage locations identified by even-numbered addresses. Since the value k of initial address AI is an even number, memory $10_2$ contains even storage locations k, k+2, and so on. Memory $10_1$ contains odd storage locations k+1, k+3, and so on.

Memory data $DM_1$ and $DM_2$, here being memory output data, are loaded into output registers $23_1$ and $23_2$ clocked by half-rate clock signal CKH to produce register output data $DS_1$ and $DS_2$. Divide-by-two circuit 28 passes every other clock pulse of clock signal CK to generate half-rate clock CKH. In response to delayed LSB address signal $H_{OD}$, output MUX 24 supplies final output data DS at a value equal to register output data $DS_1$ or $DS_2$. Delay registers 25 and 26 generate delayed signal $H_{OD}$ by applying a delay of two CK clock cycles to LSB $H_0$.

With reference to the timing waveforms shown in FIG. 3, the interleaved memory system of FIG. 2 operates in the following manner. Two periods of clock CK slightly exceed the time, including the address decode time, needed to access each of memory devices $10_1$ and $10_2$. LSB $H_0$ makes transitions at each CK pulse and thus makes transitions at slightly greater than half the memory access time.

At the beginning of the first CK cycle after the initial value k of input address signal A is loaded into holding register 21, LSB $H_0$ is set to "0" since k is an even number. LSB $H_0$ goes to "1" at the beginning of the second holding-register clock cycle. Address bit $H_1$ is, however, constant during the first two holding-register CK cycles. The information at storage locations k and k+1 is therefore simultaneously read out of memory devices $10_2$ and $10_1$ during the first two holding-register CK cycles. Subsequently, memory data $DM_2$ and $DM_1$ are loaded into output registers $23_2$ and $23_1$, causing register output data $DS_2$ and $DS_1$ to be set at the values of the information at locations k and k+1.

MUX control signal $H_{OD}$, since it is a delayed version of LSB $H_0$, makes transitions at slightly greater than half the memory access time. At the beginning of the first CK cycle after the first two holding-register CK cycles, control signal $H_{OD}$ is at "0". This causes output MUX 24 to provide final output data DS at the value of data $DS_2$ and thus at the value of the information at location k in even memory $10_2$. In the middle of the two CK cycles after the first two holding-register CK cycles, control signal $H_{OD}$ changes to "1". Final output data DS is thereafter supplied at the value of $DS_1$ and therefore at the value of the information at location k+1 in odd memory $10_1$.

During the third and fourth holding-register CK cycles, the information at storage locations k+2 in memory $10_2$ and k+3 in memory $10_1$ is also being addressed. After MUX 24 has sequentially passed the information at locations k and k+1, MUX 24 sequentially passes the information at locations k+2 and k+3. This process continues in the manner shown in FIG. 3. When the interleaved memory system of FIG. 2 reaches a "steady-state" addressing/read out condition, approximately twice as much data is read out of the memory system per unit of memory access time than what would occur if there were only one memory device. The memory access time is effectively cut in half.

Unfortunately, the memory interleaving technique used in the system of FIG. 2 requires that input address signal A be provided at values that sequentially increase. The system of FIG. 2 cannot accept random values of address signal A and simultaneously reduce the effective memory access time. Also, the effective memory access time is reduced only during read operation. No reduction in the effective memory access time occurs during write operation in the memory system of FIG. 2. It would be desirable to randomly address locations in an electronic memory while simultaneously increasing the effective decoding speed so as to reduce the effective memory access time. It would also be desirable for the reduced memory access time to be achievable during both read and write operations without sacrificing the random-addressing capability.

GENERAL DISCLOSURE OF THE INVENTION

The present invention furnishes a set of techniques for organizing an electronic memory to increase the effective decoding speed yet be able to randomly address storage locations in the memory. The increase in decoding speed translates into a decrease in the average memory access time. This improvement is achieved by providing the memory with certain repetitive circuit segments. The amount of improvement increases as the number of repetitive circuit segments increases. In particular, when there are M repetitive segments, the effective memory access time is reduced to nearly one Mth (1/M) of the otherwise normal value. Two repetitive segments yield nearly a 50% reduction in effective memory access time.

The reduced memory access time is always achieved during memory read operation in the invention. Depending on which of the memory-organization techniques of the invention is utilized, the reduced memory access time can also be achieved during write operation without losing the ability to randomly address memory storage locations. The invention thereby provides a large advance over the prior art.

An electronic memory organized according to the principles of the invention typically contains a memory array and address circuitry. The memory array electronically stores information. The address circuitry sequentially addresses information storage locations in the memory by decoding a multiplicity of sequentially supplied input memory addresses to generate a like multiplicity of respectively corresponding decoded memory addresses, each identifying one of the storage locations.

In one of the memory-organization techniques of the invention, the address circuitry contains a group of decoding segments arranged in series. Each decoding segment decodes part of each input memory address such that all the decoding segments together fully decode each input memory address to generate the corresponding decoded memory address. Each decoding segment is operable to partial decode one of the input memory addresses while each other decoding segment is simultaneously operable to partially decode a different one of the input memory addresses. Because multiple input memory addresses are simultaneously decoded by the address circuitry, the effective memory access time is reduced. The reduction in memory access time is available during both read and write operation.

Each decoding segment in the first memory-organization technique of the invention contains an input storage element (e.g., a register) and a decoder. The input storage element stores a segment input address. The decoder performs a decoding operation on the segment input address to generate a segment output address. The decoding operation consists of a partial decoding of each segment input address.

With the decoding segments being arranged in series, the segment input address stored in the first decoding segment sequentially constitutes each input memory address. The segment input address stored in each decoding segment after the first decoding segment constitutes the segment output address generated by the previous decoding segment. Finally, the segment output address generated by the last decoding segment sequentially constitutes each decoded memory address.

In another of the memory-organization techniques of the invention, the address circuitry contains a plurality of decoding segments arranged in parallel rather than in series. Each decoding segment in this memory organization technique sequentially decodes different ones of the input memory addresses than each other decoding segment. Each decoding segment is operable to decode one of the input memory addresses while at least one other decoding segment is simultaneously decoding one of the other input memory addresses. Since multiple input memory addresses are simultaneously decoded, the effective memory access time is reduced. The reduction in memory access time is again available during both read and write operation.

Each decoding segment in the second memory organization technique of the invention contains an input storage element and a decoder. The input storage element sequentially stores each input memory address supplied to that decoding segment. The decoder sequentially decodes each input memory address stored in the input storage element to generate the corresponding decoded memory address. The memory further includes decode control circuitry for providing decode control signals that cause the decoding segments to sequentially furnish the decoded memory addresses to the memory array.

In a third of the memory-organization techniques of the invention, an electronic memory contains a plurality of memory arrays and an associated address network. Each memory array stores information identical to that stored in each other memory array.

The address network in the third memory-organization technique of the invention sequentially addresses information storage locations in the memory arrays by decoding a multiplicity of sequentially supplied input memory addresses to generate a like multiplicity of respectively corresponding decoded memory addresses. Each decoded memory address identifies one storage location in each of the memory arrays. Each decoding segment sequentially decodes a different one of the input memory addresses from each other decoding segment to generate decoded memory addresses for different corresponding ones of the memory arrays. Each decoding segment is operable to decode one of the input memory addresses while at least one other decoding segment is simultaneously decoding one of the other input memory addresses. Since multiple input memory addresses are simultaneously decoded, the effective memory access time is reduced during read operation.

Each decoding segment in the third memory-organization technique preferably contains an input storage element and a decoder. The input storage element sequentially stores each input memory address supplied to that decoding segment. The decoder sequentially decodes each input memory address stored in the input storage element to generate the corresponding decoded memory address.

Each memory array, along with the decoder in the decoding segment for that memory array, in the third memory-organization technique is normally part of a separate integrated circuit, typically an off-the-shelf memory device. Consequently, the memory arrays are contained on a plurality of integrated circuits. Although the memory access time in the third memory-organization technique is typically not reduced during write operation, the third memory-organization technique can be applied to off-the-shelf memory devices.

Figure 1:
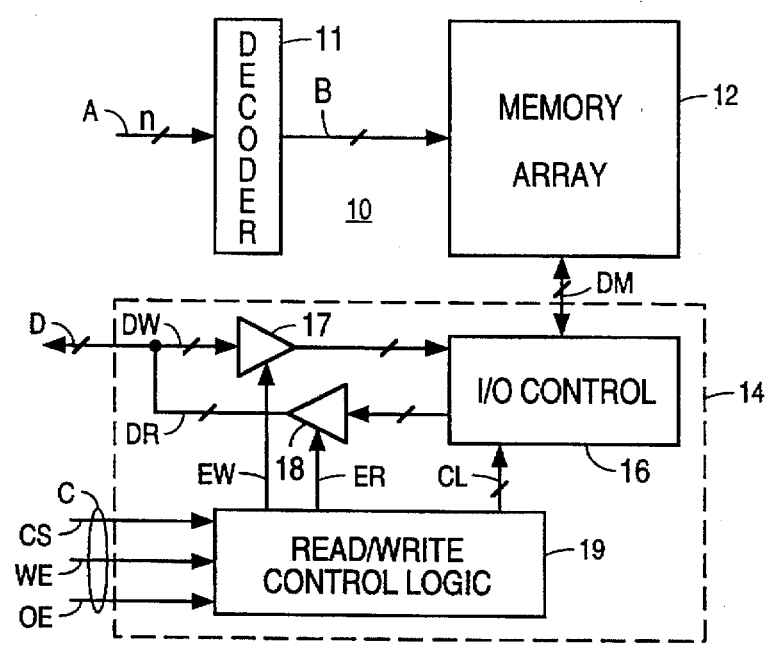
FIG. 1 is a block diagram of a conventional semiconductor memory device.
Figure 2:
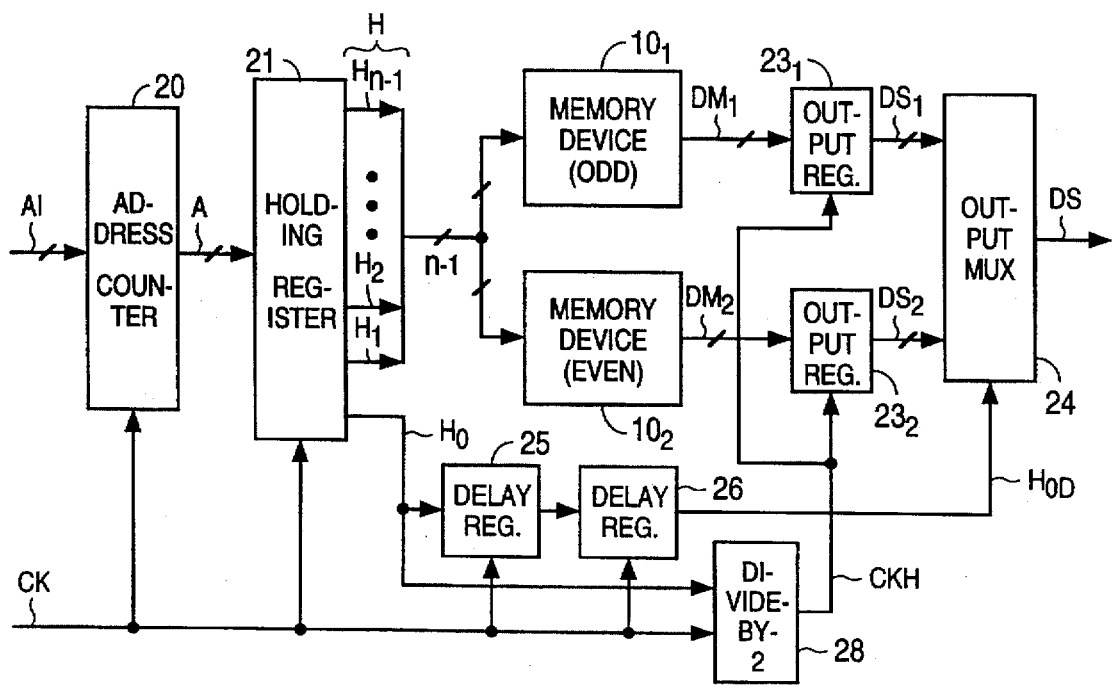
FIG. 2 is a block diagram of a conventional interleaved semiconductor memory system.
Figure 3:
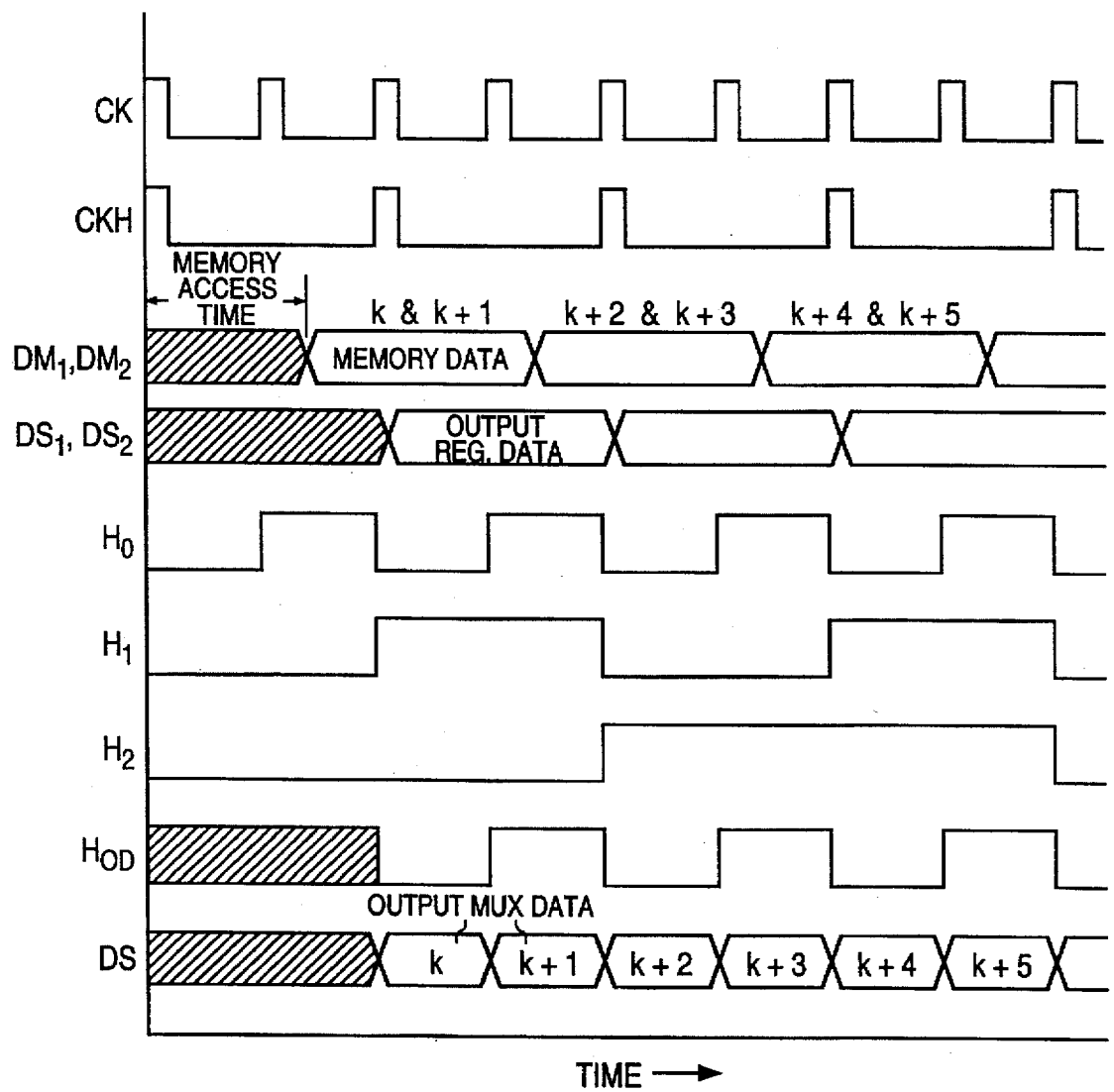
FIG. 3 is an idealized timing diagram for the conventional interleaved memory system of FIG. 2.

Like reference symbols are employed in the drawings and in the description of the preferred embodiments to represent the same, or very similar, item or items. A slash (/) across a line representing a signal in FIG. 1, 2, 4, 6, or 8 indicates that the signal is provided on multiple lines. In the timing diagrams of FIGS. 3, 5, 7, and 9, slanted shading is used to indicate undetermined conditions.

DESCRIPTION OF THE PREFERRED EMBODIMENTS

Figure 4:
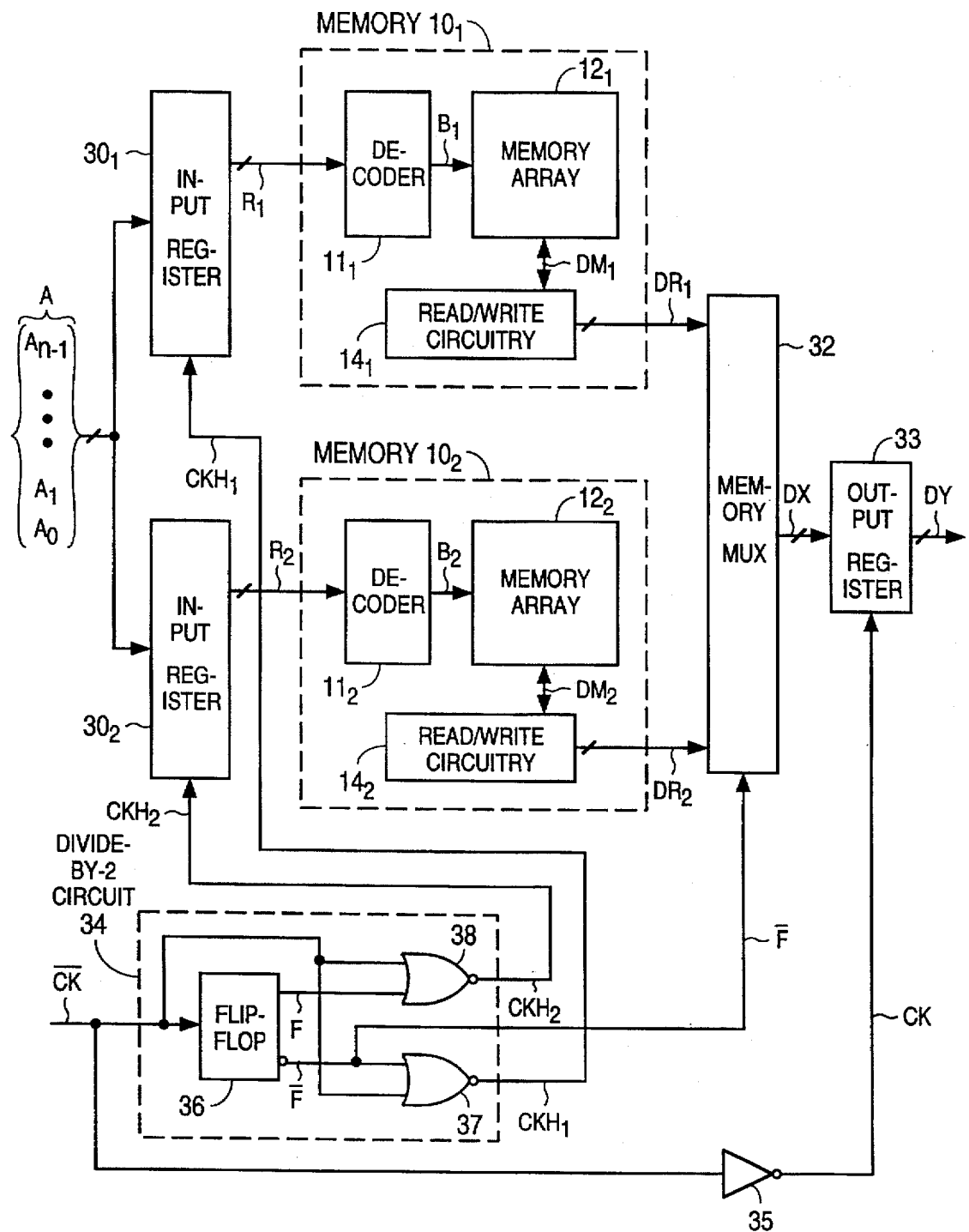
FIG. 4 is a block/logic diagram of a composite semiconductor memory system that utilizes memory devices organized in accordance with the invention.
Figure 5:
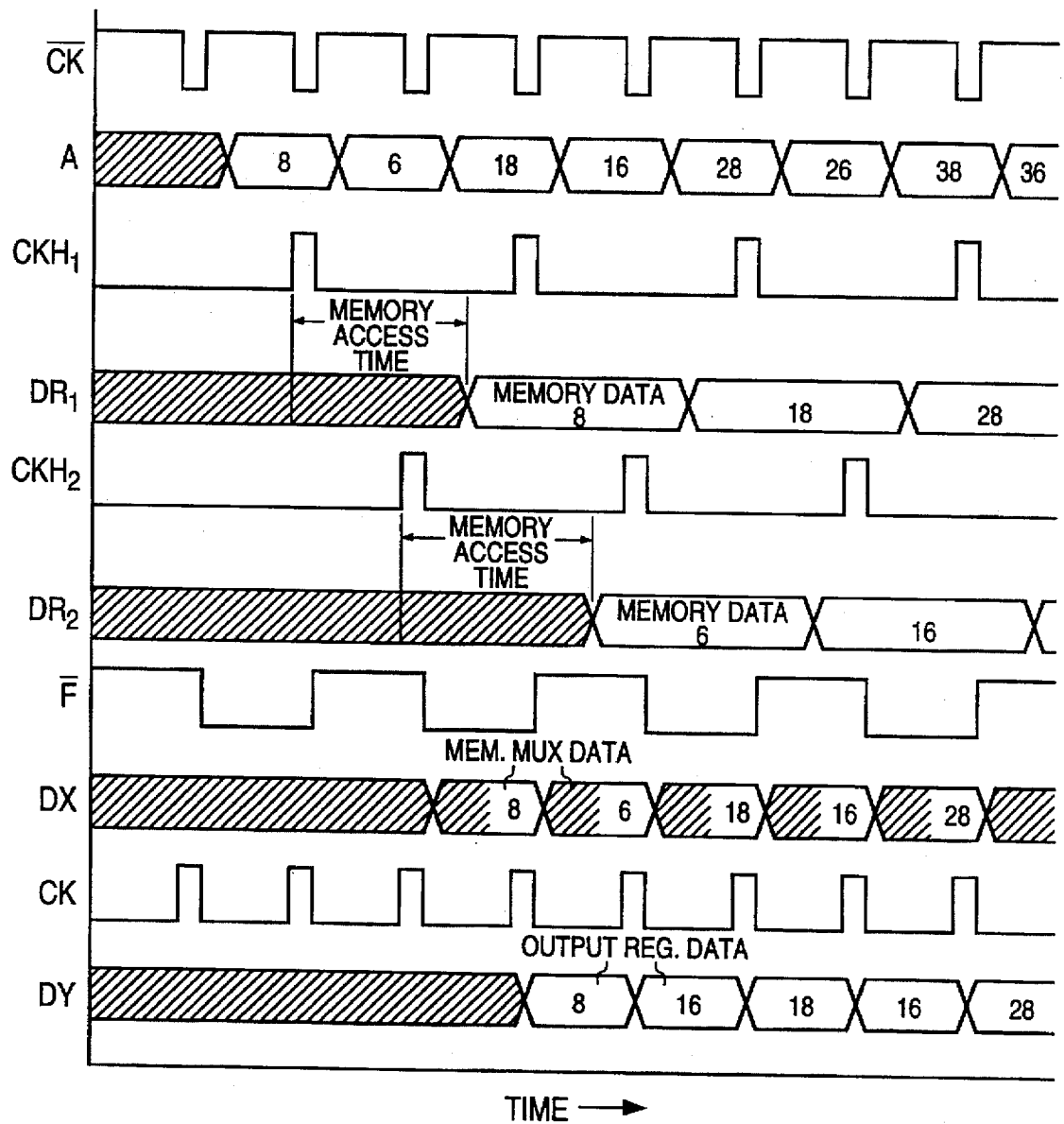
FIG. 5 is an idealized timing diagram for the composite memory of FIG. 4.

FIG. 4 illustrates a composite semiconductor memory system in which multiple addresses are decoded in parallel in accordance with the invention to reduce the effective memory access time. The composite memory system in FIG. 4 consists of a pair of input registers $30_1$ and $30_2$, a corresponding pair of memory devices $10_1$ and $10_2$, a memory multiplexer 32, an output register 33, and a divide-by-two circuit 34. Waveforms that illustrate the idealized time variations of certain of the signals present in the memory system of FIG. 4 are shown in FIG. 5.

Divide-by-two circuit 34 divides an inverted input clock signal $\overline{CK}$ in half to produce a pair of half-rate clock signal $CKH_1$ and $CKH_2$. The pulses of half-rate clocks $CKH_1$ and $CKH_2$ are offset from each other by a time period approximately equal to the period of inverted clock $\overline{CK}$ as shown in FIG. 5. The period of inverted clock $\overline{CK}$ is equal to or slightly greater than one half the average time, including the decoding time, needed to access each of memories $10_1$ and $10_2$. Consequently, the period of each of half-rate clocks $CKH_1$ and $CKH_2$ is equal to, or slightly greater than, the average memory access time.

Divide-by-two circuit 34 consists of a D-type flip-flop 36 and a pair of NOR gates 37 and 38. Inverted clock $\overline{CK}$ is supplied to the data input of flip-flop 36, causing it to generate complementary flip-flop output signals F and $\overline{F}$ that make rising and falling transitions at times corresponding to the rising edges of the negative-going $\overline{CK}$ pulses. Inverted flip-flop output signal $\overline{F}$ is provided as a third output signal of circuit 34. NOR gate 37 logically NORs inverted clock $\overline{CK}$ and inverted flip-flop output signal $\overline{F}$ to produce half-rate clock $CKH_1$. NOR gate 38 logically NORs non-inverted flip-flop output signal F and inverted clock $\overline{CK}$ to produce half-rate clock $CKH_2$.

Input memory address signal A consisting of n input address bits $A_0$–$A_{n-1}$ is provided to both of input registers $30_1$ and $30_2$. The sequentially supplied values (i.e., input memory addresses) of address signal A can randomly vary. Input registers $30_1$ and $30_2$ are respectively clocked by half-rate clocks $CKH_1$ and $CKH_2$. Since half-rate clock $CKH_1$ and $CKH_2$ are offset by the $\overline{CK}$ clock period, different values of input address signal A can be loaded into registers $30_1$ and $30_2$ by changing the value of signal A at the $\overline{CK}$ rate.

Further memory address signals $R_1$ and $R_2$ are respectively supplied from input registers $30_1$ and $30_2$ to memory devices $10_1$ and $10_2$. Each of memories $10_1$ and $10_2$ is typically part of a monolithic integrated circuit which is separate from a monolithic integrated circuit that contains the other of memories $10_1$ and $10_2$. When the I/O circuitry formed with input registers $30_1$ and $30_2$, memory MUX 32, output register 33, and divide-by-two circuit 34 constitutes all or part of a monolithic integrated circuit, the integrated circuits containing memories $10_1$ and $10_2$ are also typically separate from the integrated circuit containing the I/O circuitry.

Each of memories $10_1$ and $10_2$ is typically configured as shown in FIG. 1. Letting i be an integer that runs from 1 to 2, each memory $10_i$ consists of a decoder $11_i$, a memory array $12_i$, and read/write circuitry $14_i$. Components $11_i$, $12_i$, and $14_i$ respectively correspond to components 11, 12, and 14 in the memory of FIG. 1. Further memory address signal $R_i$ supplied to decoder $11_i$ in each memory $10_i$ corresponds to input memory address signal A in the memory of FIG. 1. Decoder $11_i$ provides memory array $12_i$ with a decoded memory address signal $B_i$ corresponding to decoded memory address signal B in FIG. 1. Memory data $DM_i$ corresponding to memory data DM in FIG. 1 moves between memory array $12_i$ and read/write circuitry $14_i$.

Each input register $30_i$ and decoder $11_i$ form an address decoding segment $30_i/11_i$. Since half-rate clocks $CKH_1$ and $CKH_2$ are offset from each other, each of the decoding segments can decode a different value of input address signal A than the other decoding segment. In particular, let the decoding operation of a value of input address signal A in each decoding segment $30_i/11_i$ be roughly divided into two halves. The second half of the decoding of an input memory address in decoding segment $30_1/11_1$ is then performed at the same time as the first half of the decoding of the next input memory address in decoding segment $30_2/11_2$, and vice versa. Decoding segments $30_1/11_1$ and $30_2/11_2$ thereby constitute a composite parallel memory addressing network that decodes sequential values of input address signal A to provide memory arrays $12_1$ and $12_2$ with sequentially decoded addresses in the form of decoded address signals $B_1$ and $B_2$.

Memories $10_1$ and $10_2$ provide read data $DR_1$ and $DR_2$. During read operation in which memory data $DM_i$ is read out of each memory array $12_i$, read/write circuitry $14_i$ provides read data $DR_i$ at the value of data $DM_i$. Read data $DR_i$ thus corresponds to data D in FIG. 1 for the case in which data D is read data DR.

Read data $DR_1$ and $DR_2$ are supplied to memory MUX 32 controlled by inverted flip-flop output signal $\overline{F}$. MUX 32 provides MUX output data DX. When control signal $\overline{F}$ is "0", MUX 32 generates MUX data DX at the value of data $DR_1$ read out from memory $10_1$. When signal $\overline{F}$ is "1", MUX data DX is generated at the value of data $DR_2$ read out from memory $10_2$.

MUX data DX is loaded into output register 33 controlled by non-inverted clock signal CK. Inverter 35 generates clock CK by inverting clock $\overline{CK}$. Final output data DY is provided from output register 33 at the values of the information stored at the memory locations addressed by the sequential values of input address signal A.

Referring to FIG. 5, it illustrates an example of how a sequence of random input memory addresses 8, 6, 18, 16, 28, 26, 38, 36, and so on are supplied as input address signal A to read information out of memories $10_1$ and $10_2$. Input address 8, the first value of address signal A, is loaded into input register $30_1$ at the first $CKH_1$ pulse after which address 6, the next value of address signal A, is loaded into register $30_2$ at the first $CKH_2$ pulse. Subsequently, input address 18 is loaded into register $30_1$ at the second $CKH_1$ pulse after which input address 16 is loaded into register $30_2$ at the second $CKH_2$ pulse. This procedure continues sequentially with input addresses 28, 26, 38, 36, and so on.

Decoder $11_1$ decodes input address 8. Initially, decoder $11_2$ is effectively inactive. While decoder $11_1$ is completing the decode of input address 8 and supplying the decoded address to memory array $12_1$, decoder $11_2$ begins decoding input address 6. As decoder $11_2$ completes the decoding of input address 6 and supplies the decoded address to memory array $12_2$, decoder $11_1$ begins decoding input address 18. The process continues in an alternating manner with input addresses 16, 28, 26, 38, 36, and so on. Memories $10_1$ and $10_2$ thus operate in an alternating mode in which one decoder $11_1$ or $11_2$ completes the decoding of one input memory address and supplies the decoded address to corresponding memory array $12_1$ or $12_2$ while the other decoder $11_2$ or $11_1$ is beginning the decoding of the next sequentially supplied input memory address.

Read data $DR_1$ is first supplied from memory $10_1$ at the value of the information contained in storage location 8 in memory array $12_1$ after which read data $DR_2$ is supplied from memory $10_2$ at the value of the information contained in storage location 6 in memory array $12_2$. Under the control of inverted flip-flop output signal $\overline{F}$ which makes transitions at times corresponding to the $\overline{CK}$ clock pulses, MUX output data DX is supplied at the value of the information at location 8 in memory array $12_1$ and then at the value of the information at location 6 in memory array $12_2$.

The foregoing process continues in an alternating manner with the information contained at storage locations 18 in array $12_1$, 16 in array $12_2$, and so on. That is, as (a) read data $DR_1$ is sequentially generated at the values of the information at locations 18, 28, 38, and so on in array $12_1$ and (b) read data $DR_2$ is sequentially generated at the values of the information at locations 16, 26, 36, and so on in memory array $12_2$, MUX data DX is sequentially generated at the values of the information contained in storage locations 18, 16, 28, 26, 38, 36, and so on. The slanted shading at the beginning of each DX cycle in FIG. 5 indicates the time for MUX data DX to settle.

Clock CK, which controls output register 33, has the same period as inverted clock $\overline{CK}$. The CK pulses thus occur at the transitions of control signal $\overline{F}$. As a result, final output data DY is sequentially supplied from output register 33 at the values of the information contained in storage locations 8, 6, 18, 16, 28, 26, 38, 36, and so on.

As indicated in FIG. 5, the actual memory access time is equal to or slightly less than two CK periods. When the memory of FIG. 4 reaches a "steady-state" decoding condition, data is read out of one or the other of memories $10_1$ and $10_2$ every CK period. The parallel decoding provided by the address circuitry formed with decoding segments $30_1/11_1$ and $30_2/11_2$ thereby enables the effective memory access time to be cut nearly in half.

The memory access time could be reduced even further by providing the composite memory of FIG. 4 with additional combinations of input register $30_i$ and memory $10_i$ and thus with further decoding segments $30_i/10_i$. When there are M input registers $30_1, 30_2, \ldots$ and $30_M$ and M corresponding memories $10_1, 10_2, \ldots$ and $10_M$, the average memory access time is reduced to approximately one Mth of the value that would otherwise occur. In this case, divide-by-two circuit 34 is replaced with a divide-by-M circuit that generates M partial-rate clocking signals $CKH_1, CKH_2, \ldots$ and $CKH_M$. In addition, MUX 32 is replaced with an M-to-1 MUX. Inverted flip-flop output signal $\overline{F}$ is replaced with a control signal that enables the so-substituted MUX to sequentially make M different selections.

Figure 6:
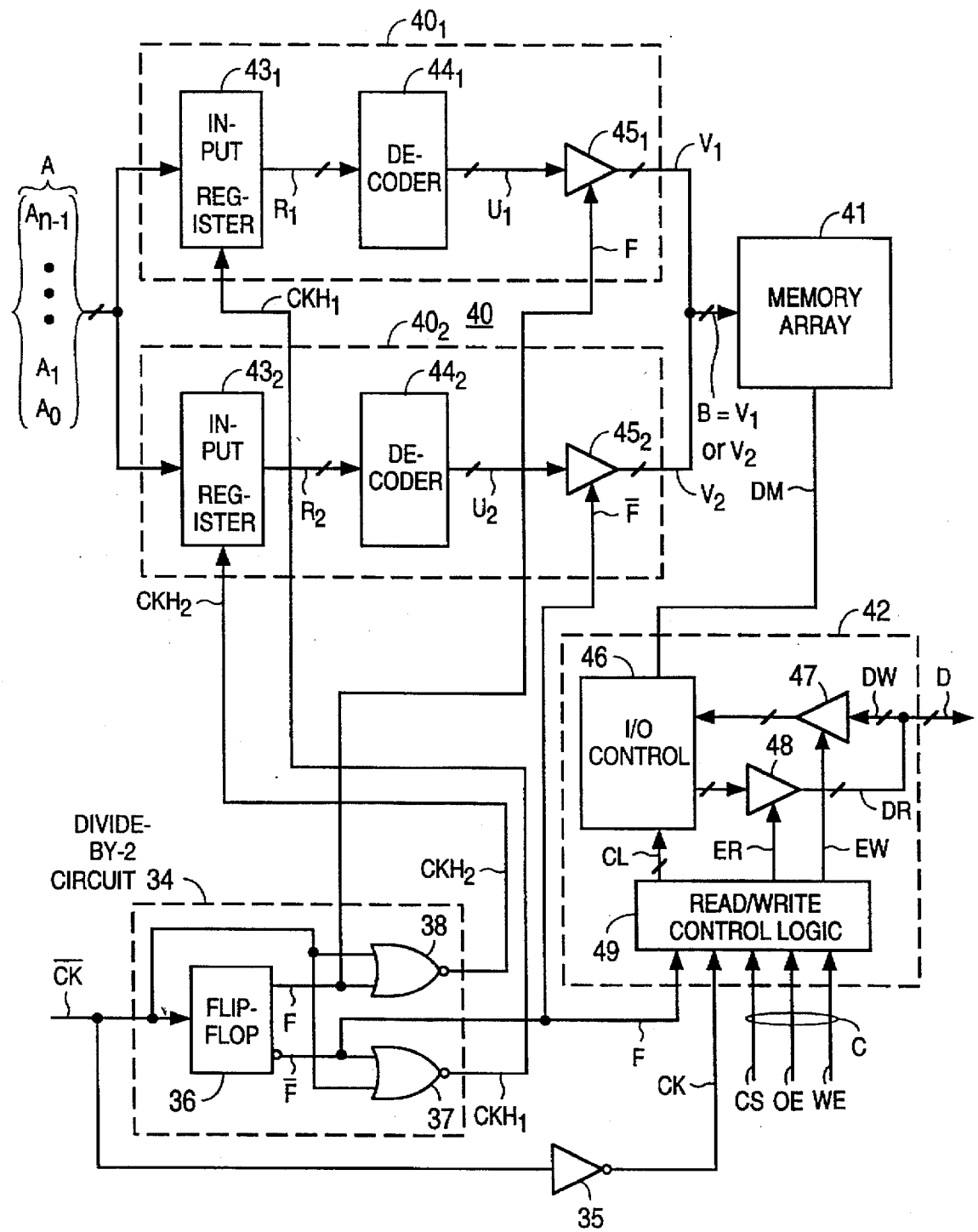
FIG. 6 is a block/logic diagram of a semiconductor memory organized in accordance with the invention.
Figure 7:
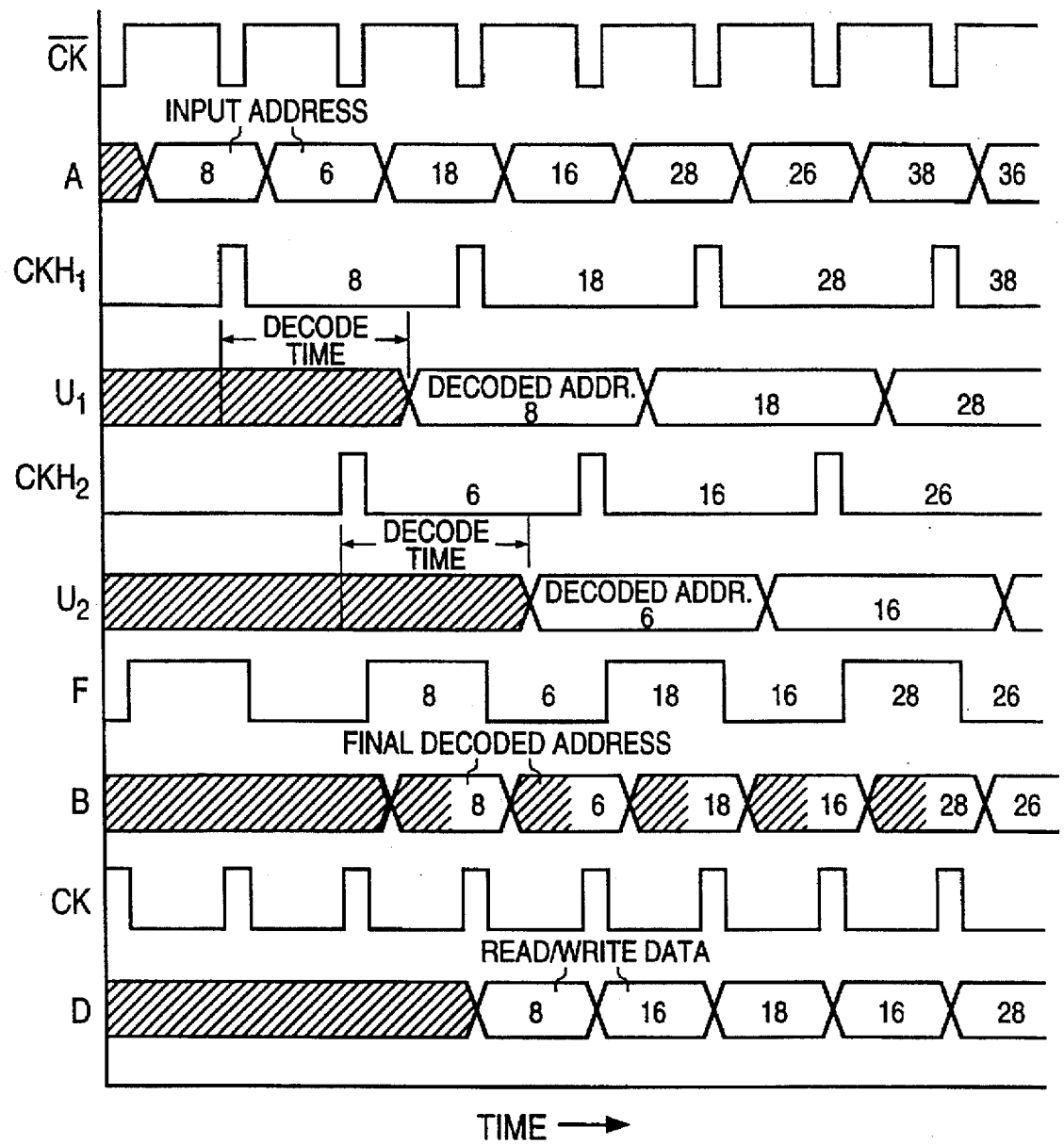
FIG. 7 is an idealized timing diagram for the memory of FIG. 6.

FIG. 6 illustrates a semiconductor memory in which multiple addresses that can vary randomly are simultaneously decoded in accordance with the invention to reduce the effective memory access time during both read and write operation. The memory in FIG. 6 consists of parallel memory address circuitry 40, a memory array 41, read/write circuitry 42, and divide-by-two circuit 34. Parallel address circuitry 40 is formed with a pair of decoding segments $40_1$ and $40_2$. Waveforms that illustrate the idealized time variations of certain of the signals present in the memory of FIG. 6 are illustrated in FIG. 7.

Input memory address signal A is supplied to both of decoding segments $40_1$ and $40_2$ in the memory of FIG. 6. The values (i.e., input memory addresses) of address signal A can be random. Decoding segments $40_1$ and $40_2$ generate decoded address signals $V_1$ and $V_2$. Letting i again be an integer running from 1 to 2, each decoding segment $40_i$ consists of an input register $43_i$, a decoder $44_i$, and a segment output buffer $45_i$.

Input registers $43_1$ and $43_2$, both of which receive input address signal A, are respectively clocked by half-rate clock signals $CKH_1$ and $CKH_2$ that have the same characteristics as in the composite memory of FIG. 4. Divide-by-two circuit 34 in the memory of FIG. 6 is configured, and operates, in the same way as in the memory of FIG. 4. Since half-rate clocks $CKH_1$ and $CKH_2$ are offset by a time period equal to one $\overline{CK}$ period, input register $43_1$ can receive one value of input address signal A at the first $CKH_1$ pulse after which input register $43_2$ receives the next sequential value of address signal A at the first $CKH_2$ pulse. Register $43_1$ thereafter receives the third sequential value of address signal A at the second $CKH_1$ pulse after which register $43_2$ receives the fourth sequential value of address signal A at the second $CKH_2$ pulse. This alternating process continues through the entire sequence of addresses.

Input registers $43_1$ and $43_2$ provide further memory address signals $R_1$ and $R_2$ to decoders $44_1$ and $44_2$. Decoders $44_1$ and $44_2$ operate simultaneously in parallel to decode alternating values of input address signal A as supplied through registers $43_1$ and $43_2$.

In particular, let each decoding operation be divided roughly into two halves. Decoder $44_1$ begins to decode the first input memory address. Initially, decoder $44_2$ is effectively inactive. As decoder $44_1$ performs the second half of the decoding operation on the first input address, decoder $44_2$ performs the first half of the decoding operation on the second sequentially supplied input memory address. While decoder $44_2$ is performing the second half of the decoding operation on the second address, decoder $44_1$ performs the first half of the decoding operation on the third sequentially supplied input memory address. This process continues in an alternating address manner through all the input memory addresses.

Decoded address signals $U_1$ and $U_2$ are supplied from decoders $44_1$ and $44_2$ to segment buffers $45_1$ and $45_2$ respectively controlled by flip-flop output signals F and $\overline{F}$. Buffers $45_1$ and $45_2$ furnish decoded memory address signals $V_1$ and $V_2$.

When control signal F is at "1", buffer $45_1$ is enabled and provides decoded address signal $V_1$ at the decoded value of signal $U_1$. Control signal $\overline{F}$ is simultaneously at "0" so as to disable buffer $45_2$. Decoded address signal $V_2$ is not asserted, the output terminal of buffer $45_2$ being in a high-impedance condition.

The reverse occurs when control signal $\overline{F}$ is at "1" and control signal F is at "0". Buffer $45_2$ is enabled and provides decoded address signal $V_2$ at the decoded value of signal $U_2$. Buffer $45_1$ is disabled. Decoded address signal $V_1$ is not asserted, the output terminal of buffer $45_1$ being in a high-impedance condition.

Decoded address signals $V_1$ and $V_2$ are supplied on the same lines to memory array 41. In FIG. 6, the signal on these input lines to memory array 41 is indicated as decoded memory address signal B. Although decoded address signal B takes on the values of both of signals $V_1$ and $V_2$, each of signals $V_1$ and $V_2$ is non-asserted when the other is at the value of a decoded memory address. Consequently, the value of decoded address B equals the value of only one of signals $V_1$ and $V_2$ at any time.

Similar to what is done in the composite memory of FIG. 4, the period of inverted clock $\overline{CK}$ in the memory of FIG. 6 is chosen to be equal to, or slightly greater than, 50% of the time that each decoding segment $40_i$ needs to access memory array 41. Control signals F and $\overline{F}$ make transitions at times corresponding to the $\overline{CK}$ clock pulses. After the memory of FIG. 6 has reached a "steady-state" decoding condition, a decoded memory address is provided to memory array 41 during each $\overline{CK}$ clock pulse and thus in a time equal to, or slightly less than, 50% of the otherwise normal memory access time. Consequently, the use of multiple decoding segments $40_1$ and $40_2$ in the memory of FIG. 6 reduces the effective memory access time.

Decoding segments $40_1$ and $40_2$ are utilized to increase the decoding speed for both read and write operation in the memory of FIG. 6. Memory data DM passes from memory array 41 to read/write circuitry 42, or vice versa, depending on whether a read or write operation is being performed.

Read/write circuitry 42 consists of I/O control circuit 46, a data-in buffer 47, a data-out buffer 48, and read/write control logic 49. Components 46-49 are configured and operable similar to components 16-19 in the memory of FIG. 1 except that read/write control logic 49 in FIG. 6 also responds to control signal $\overline{F}$. Clock CK is explicitly shown as being provided to control logic 49 in the memory of FIG. 6. Also, for proper alignment of data during write operations, I/O control circuit 46 contains two holding registers (not shown). Write data DW is passed through as many holding registers as the number of decoding segments—two in this example—before being passed to memory array 41 as memory data DM. Similarly, control signals CS, WE, and OE go through holding registers (not shown) for proper signal alignment.

FIG. 7 illustrates an example of how a sequence of random input memory addresses are supplied as address signal A to decoder segments $40_1$ and $40_2$ in the memory of FIG. 6 for reading information out of, or writing information into, memory array 41. The sequence of random addresses in FIG. 7 is the same as in FIG. 5.

Input address 8, the first address, is loaded into input register $43_1$ for decoding by decoder $44_1$ after which input address 6, the next address, is loaded into input register $43_2$ for decoding by decoder $44_2$. As decoder $44_2$ performs the first half of the decoding of input address 6, decoder $44_1$ performs the last half of the decoding of input address 8 for supply through segment buffer $45_1$ to address storage location 8 in memory array 41. Third input address 18 is thereafter loaded into register $43_1$ for decoding by decoder $44_1$ as decoder $44_2$ completes the decoding of input address 6 for supply through segment buffer $45_2$ to address storage location 6 in array Similarly, fourth input address 16 is subsequently loaded into register $43_2$ for decoding by decoder $44_2$ while decoder $44_1$ is completing the decoding of input address 18 for supply through buffer $45_1$ to address storage location 18 in array 41. This alternating process, in which the last half of the decoding of each input address timewise overlaps the first half of the decoding of the next input address, continues with further input addresses 28, 26, 38, and 36. The slanted shading for decoded address signal B in FIG. 7 indicates the time needed for decoders $44_1$ and $44_2$ and buffers $45_1$ and $45_2$ to settle.

In the memory of FIG. 6, one decoded memory address is provided to memory array 41 during each $\overline{CK}$ clock cycle after the second $\overline{CK}$ clock cycle. Since two $\overline{CK}$ clock cycles equal, or slightly exceed, the average time taken by decoder $44_i$, including the transit time through corresponding buffer $45_i$, to decode an input memory address, the memory access time is effectively reduced by nearly 50%. The reduction in memory access time is achieved during both read and write operation with input address signal A being supplied at random values.

Additional reduction in the memory access time can be achieved by providing the memory of FIG. 6 with one or more additional decoding segments $40_1$. By modifying the memory of FIG. 6 to include M decoding segments $40_1, 40_2, \ldots$ and $40_M$, the average memory access time is reduced approximately to one Mth of the value that would otherwise exist. In so doing, divide-by-two circuit 34 is replaced with a divide-by-M circuit that provides M partial-rate clock signals $CKH_1, CKH_2, \ldots$ and $CKH_M$, where the pulses of each partial rate clock signal $CKH_i$ are separated from each adjacent partial-rate clock signal $CKH_{i-1}$ and/or $CKH_{i+1}$ by a time period equal to, or slightly greater than, one Mth of the average memory access time. Control signals F and $\overline{F}$ are likewise replaced with M control signals $F_i$, each of which is at "1" during the completion of the decoding in corresponding decoding segment $40_i$ and is "0" otherwise. I/O control circuit 46 is provided with M holding registers for properly aligning write data DW in converting it into memory data DM during write operation.

Figure 8:
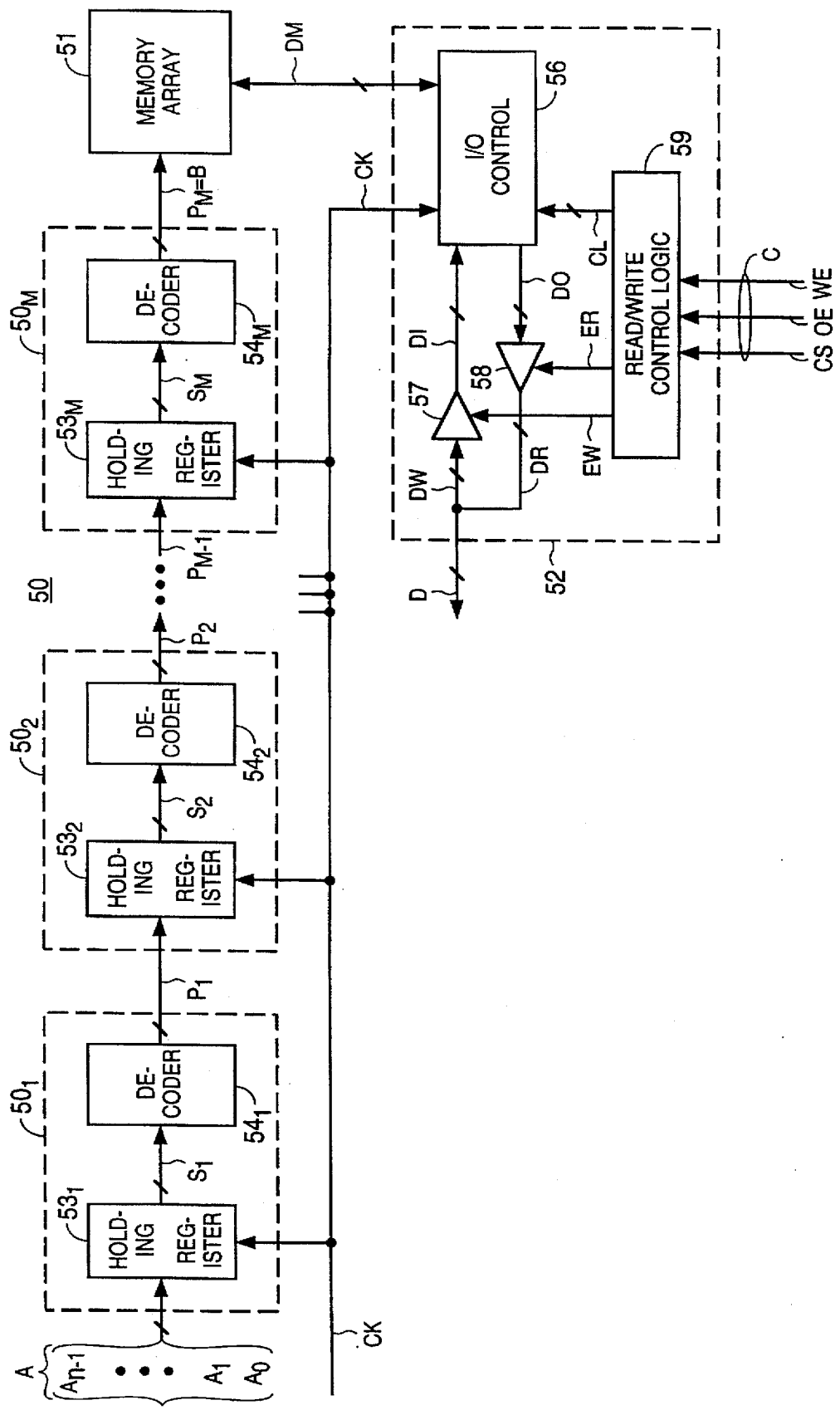
FIG. 8 is a block diagram of another semiconductor memory organized in accordance with the invention.
Figure 9:
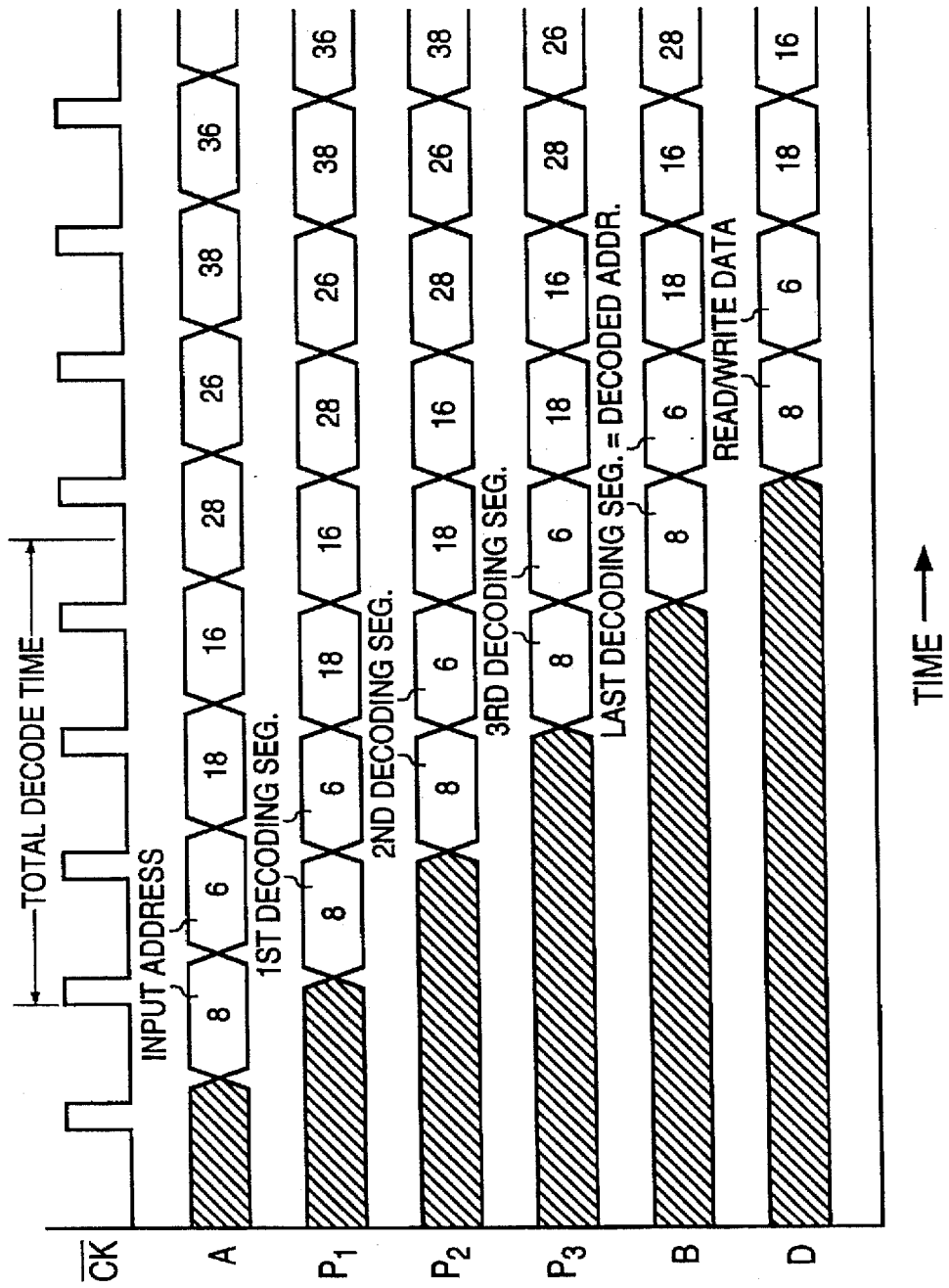
FIG. 9 is an idealized timing diagram for the memory of FIG. 8.

FIG. 8 illustrates another semiconductor memory in which multiple addresses that can vary randomly are simultaneously decoded in accordance with the invention to reduce the effective memory access time during both read and write operation. In contrast to the memory of FIG. 6 where a parallel decoding technique is used, the memory of FIG. 8 utilizes a serial decoding technique. The memory of FIG. 8 consists of serial memory address circuitry 50, a memory array 51, and read/write circuitry 52. Serial address circuitry 50 is formed with M serially connected decoding segments $50_1, 50_2, \ldots$ and $50_M$. Waveforms representing idealized time-variations of certain of the signals present in the memory of FIG. 8 are shown in FIG. 9.

Input memory address signal A, again consisting of bits $A_0-A_{n-1}$, is supplied to decoding segment $50_1$. Letting i now be an integer that runs from 1 to M, each decoding segment $50_i$ provides a partial decoding of each value of input address signal A. In so doing, each decoding segment $50_i$ generates a segment output address signal $P_i$. As a segment input address signal, each decoding segment $50_i$ except first decoding segment $50_1$ receives segment output address signal $P_{i-1}$ from immediately previous decoding segment $50_{i-1}$. Consequently, each segment output address signal $P_i$ except for last segment output address signal $P_M$ provides a partial decoding of input address signal A, the accumulative amount of partial decoding increasing as i increases. Last segment address signal $P_M$ constitutes fully decoded memory address signal B supplied to memory array 51.

Each decoding segment $50_i$ consists of a holding register $53_i$ and a decoder $54_i$. Holding register $53_i$ stores a segment input address on which decoder $54_i$ performs a decoding operation to generate a segment output address. The decoding operation in decoder $54_i$ constitutes a partial decoding of each sequentially supplied input memory address.

More particularly, clock signal CK is supplied to all of holding registers $53_1-53_M$. At each CK pulse, the value (i.e., input memory address) of address signal A is loaded into first holding register $53_1$. Similarly, at each CK pulse, holding register $53_i$ in each decoding segment $50_i$ except first decoding segment $50_1$ is loaded with the value of output address signal $P_{i-1}$ from previous decoding segment $50_{i-1}$. Each holding register $53_i$ supplies an intermediate address signal $S_i$ whose value (the segment input address) is decoded by decoder $54_i$ to produce segment output address signal $P_i$.

The period of clock CK is chosen to be equal to, or slightly greater than, one Mth of the total decoding time that would be needed if there were just one normal decoder as in the conventional memory of FIG. 1. This enables each decoder $54_i$ to provide approximately one Mth of the total memory address decoding. Since there are M decoders $54_i$, decoding segments $50_1-50_M$ provide a full decoding of each value of input address signal A.

During "steady-state" decoding operation, each decoding segment $50_i$ performs a partial decoding of one value of input address signal A while each other decoding segment $50_j$ performs a partial decoding of another value of address signal A. M values of address signal A are therefore simultaneously in various stages of decoding at any time during steady-state operation.

Decoded memory address signal B provided from last decoding segment $50_M$ is updated once each CK cycle. Since the period of clock CK is equal to, or slightly greater than, one Mth of the total decoding time, the average decoding time is reduced to approximately one Mth of the decoding time otherwise required by a normal decoder such as decoder 11 in the memory of FIG. 1. The serial arrangement of address circuitry 50 provides simultaneous decoding of multiple values of input address signal A and thereby substantially reduces the effective memory access time, typically to a value on the order of one Mth of the otherwise normal memory access time. The reduced memory access time is achieved during both read and write operation with address signal A being supplied at random values.

Memory data DM is transferred between memory array 51 and read/write circuitry 52. During read operation, memory data DM is read out of memory array 51 at the storage locations addressed by input address signal A. During write operation, memory data DM is written into memory array 51 at the storage locations addressed by address signal A.

Read/write circuitry 52 consists of an I/O control circuit 56, a data-in buffer 57, a data-out buffer 58, and read/write control logic 59. Components 56–59 are configured and operable similar to components 16–19 in the memory of FIG. 1 except that I/O control circuit 56 here receives clock signal CK. For proper alignment of data during write operations, I/O control circuit 56 contains M holding registers (not shown) through which write data DW is passed in being converted into memory data DM supplied to memory array 51—i.e., there are as many holding registers for write data DW as the number of decoding segments 50. Control signals CS, WE, and OE likewise go through holding registers (not shown) for proper signal alignment.

FIG. 9 illustrates an example of how a sequence of random input memory addresses are supplied as address signal A to the memory of FIG. 8 for addressing storage locations in memory 51 during both read and write operation. As with the address example given above in FIG. 7 for the memory of FIG. 6, the addresses utilized in FIG. 9 for the memory of FIG. 8 are the same as those used in FIG. 5 for the memory of FIG. 4. FIG. 9 illustrates an example in which M is 4—i.e., there are four decoding segments $50_1-50_4$.

At the first CK clock pulse during which input address 8 is presented to address circuitry 50, input address 8 is loaded into holding register $53_1$ for partial decoding by decoder $54_1$ to produce segment output address signal $P_1$ at a partially decoded value of input address 8. At the next CK pulse, the partially decoded value of input address 8 is loaded into holding register $53_2$ for partial decoding by decoder $54_2$ to produce segment output address signal $P_2$ at a further partially decoded value of input address 8. Simultaneously, input address 6 is loaded into register $53_1$ for decoding by decoder $54_1$ to generate output address signal $P_1$ at a partially decoded value of input address 6.

The foregoing process continues sequentially with input addresses 18 and 16 up to the point at which decoders $54_1$, $54_2$, and $54_3$ are providing partial decodings of input addresses 16, 18, and 6 while last decoder $54_4$ is completing the decoding of first input address 8 in order to address storage location 8 in memory array 51. The memory of FIG. 8 is now at steady-state. Input address 28 is subsequently supplied to register $53_1$ for decoding by decoder $54_1$ as the partially decoded versions of addresses 16, 18, and 6 simultaneously move down the decoder chain. Last decoder $54_M$ simultaneously completes the decoding of address 6 and provides the fully decoded address to memory array 51 for addressing storage location 6. The process continues as input addresses 26, 38, 36 and so on are sequentially presented to decoding segment $50_1$. As the decoding of one address begins in decoding segment $50_1$, the decoding of the address entered into segment $50_1$ four CK cycles earlier is completed in last segment $50_4$.

In the preceding example where M is 4, the total time that would be needed to decode input address signal A in the prior art memory of FIG. 1 equals, or is slightly less than, four CK cycles in the memory of FIG. 8. Since one fully decoded address is provided each CK cycle, the decoding speed is increased by a factor of nearly four during both read and write operation for random input memory addresses.

Figure 10:
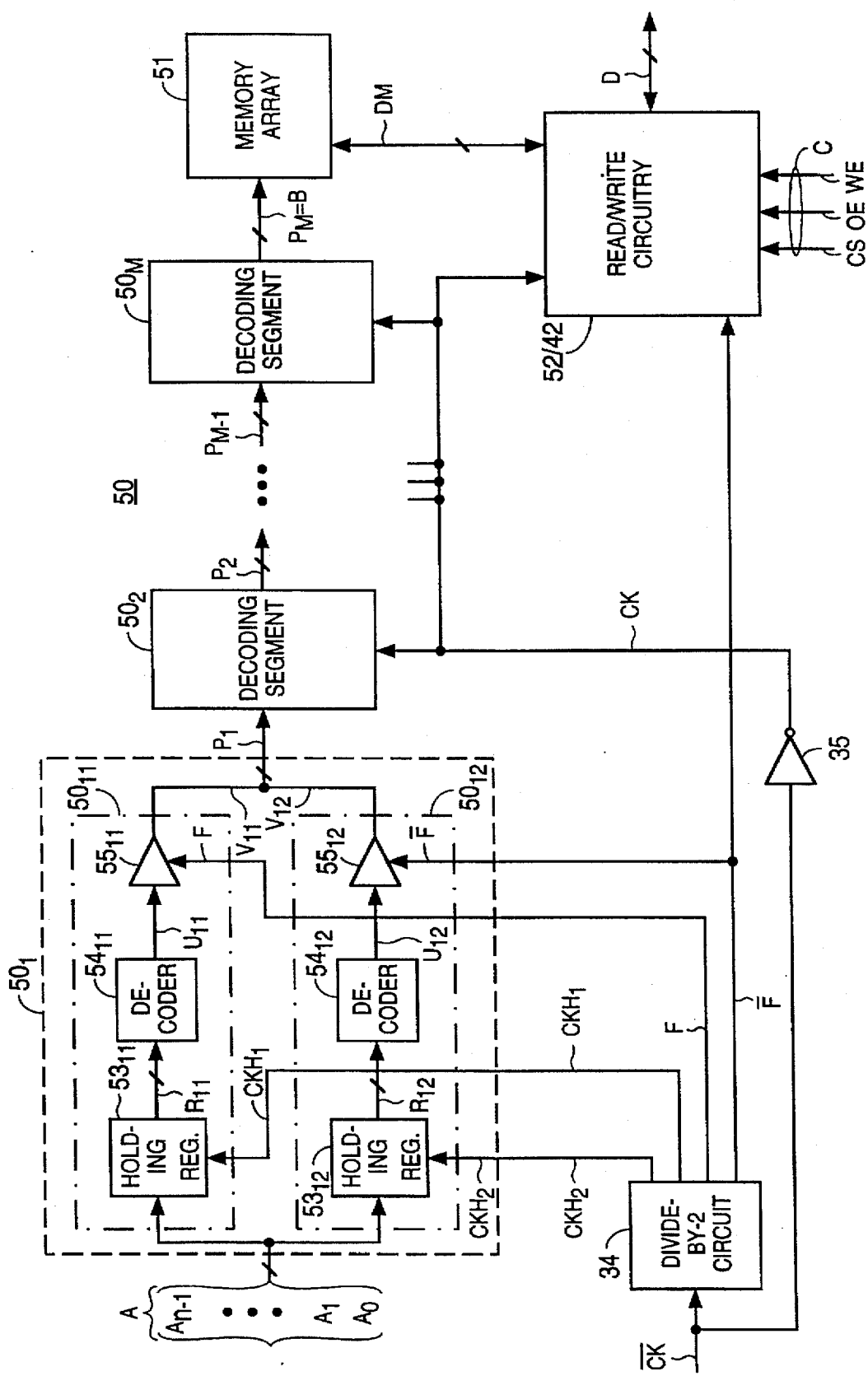
FIG. 10 is a block diagram of yet another semiconductor memory organized in accordance with the invention.

The serial memory organization technique employed in the memory of FIG. 8 can be combined with the parallel memory organization technique utilized in the memory of FIG. 6. FIG. 10 illustrates an example of how the two techniques are combined to produce a semiconductor memory in which multiple addresses that can vary randomly are simultaneously decoded in accordance with the invention to reduce the effective memory access time during both read and write operations.

The memory of FIG. 10 contains decoding segments $50_1$–$50_M$ arranged and operable the same as in the memory of FIG. 8 except that decoding segment $50_1$ in FIG. 10 consists of two decoding subsegments $50_{11}$ and $50_{12}$. Decoding subsegment $50_{11}$ contains a holding register $53_{11}$, a decoder $54_{11}$, and a subsegment output buffer $55_{11}$ that respectively correspond to and operate the same as input register $43_1$, decoder $44_1$, and segment output buffer $45_1$ in decoding segment $40_1$ of the memory of FIG. 6 except that components $53_{11}$, $54_{11}$, and $55_{11}$ provide only a partial decoding of each input memory address value supplied to decoding subsegment $50_{11}$. Decoding subsegment $50_{12}$ similarly contains a holding register $53_{12}$, a decoder $54_{12}$, and a subsegment output buffer $55_{12}$ that respectively correspond to and operate the same as input register $43_2$, decoder $44_2$, and segment output buffer $45_2$ in decoding segment $40_2$ of the memory of FIG. 6 except that components $53_{12}$, $54_{12}$, and $55_{12}$ provide only a partial decoding of each input memory address value supplied to decoding subsegment $50_{12}$.

Alternating values of input memory address A are supplied to holding registers $53_{11}$ and $53_{12}$ which provide corresponding further memory address signals $R_{11}$ and $R_{12}$ respectively corresponding to further memory address signals $R_1$ and $R_2$ in the memory of FIG. 6. Decoders $54_{11}$ and $54_{12}$ partially decode further memory address signals $R_{11}$ and $R_{12}$ to produce partially decoded memory address signals $U_{11}$ and $U_{12}$ respectively corresponding to decoded address signals $U_1$ and $U_2$ in the memory of FIG. 6. Buffers $55_{11}$ and $55_{12}$ alternatingly pass partially decoded address signals $U_{11}$ and $U_{12}$ to produce partially decoded memory address signals $V_{11}$ and $V_{12}$ respectively corresponding to decoded address signals $V_1$ and $V_2$ in the memory of FIG. 6. Segment output memory address signal $P_1$ is provided at the value of partially decoded memory address $V_{11}$ or $V_{12}$ depending on which of buffers $55_{11}$ and $55_{12}$ is enabled.

The memory of FIG. 10 contains divide-by two circuit 34 that generates half-rate clocks $CKH_1$ and $CKH_2$ and control signals F and $\overline{F}$ for supply to holding registers $53_{11}$ and $53_{12}$ and buffers $55_{11}$ and $55_{12}$. Inverter 35 again converts inverted clock $\overline{CK}$ into clock CK. Finally, the memory of FIG. 10 contains read/write circuitry 52/42 which basically constitutes an amalgamation of read/write circuitries 52 and 42.

In the memory of FIG. 10, decoding segment $50_1$ could have more than two such decoding subsegments arranged in parallel. Instead of configuring decoding segment $50_1$ as two or more decoding subsegments arranged in parallel, any of the other decoding segments—e.g., decoding segment $50_M$—in the memory of FIG. 10 could be provided with two or more such decoding subsegments arranged in parallel. Also, two or more of decoding segments $50_1$–$50_M$ could be so arranged.

While the invention has been described with reference to particular embodiments, this description is solely for the purpose of illustration and is not to be construed as limiting the scope of the invention claimed below. For example, divide-by-two circuit 34 in the memories of FIGS. 4 and 6 could be modified so as to respond to non-inverted clock CK. Similarly, address circuitry 50 in the memory of FIG. 8 could be modified to operate in response to inverted clock $\overline{CK}$. Buffers $45_1$ and $45_2$ in the memory of FIG. 6 could be replaced with a set of pairs of AND gates and a corresponding set of EXCLUSIVE OR gates. Various modifications and applications may thus be made by those skilled in the art without departing from the true scope and spirit of the invention as defined in the appended claims.

We claim:

1. An electronic memory comprising:
    a memory array for electronically storing information; and
    address means for sequentially addressing information storage locations in the memory array by decoding a multiplicity of sequentially supplied input memory addresses to generate a like multiplicity of respectively corresponding decoded memory addresses, each identifying one of the storage locations, the address means comprising a plurality of decoding segments arranged in series, each decoding segment decoding part of each input memory address such that all the decoding segments together fully decode each input memory address to generate the corresponding decoded memory address, each decoding segment being operable to partially decode one of the input memory addresses while each other decoding segment is simultaneously operable to partially decode a different one of the input memory addresses.

2. A memory as in claim 1 wherein the decoding segments are sequentially designated as the first decoding segment through the last decoding segment, each decoding segment comprising:

an input storage element for storing a segment input address; and a decoder for performing a decoding operation on the segment input address to generate a segment output address, the decoding operation constituting a partial decoding of each input memory address, the segment input address stored in the first decoding segment sequentially constituting each input memory address, the segment input address stored in each decoding segment after the first decoding segment constituting the segment output address generated by the previous decoding segment, the segment output address generated by the last decoding segment sequentially constituting each decoded memory address.

3. A memory as in claim 2 wherein a common clocking signal is furnished to the input storage elements for causing the segment input addresses to be loaded into the input storage elements.

4. A memory as in claim 2 wherein the decoding segments are operable to simultaneously perform partial decodings of a like plurality of the input memory addresses.

5. A memory as in claim 1 further including input/output means for writing information into, and reading information out of, the memory array upon being sequentially addressed by the address means.

6. A memory as in claim 1 wherein the sequentially supplied input memory addresses can have random values.

7. A memory as in claim 1 where at least one specified one of the decoding segments comprises a plurality of decoding subsegments arranged in parallel, each decoding subsegment sequentially partially decoding a different one of the input memory addresses from each other decoding subsegment, each decoding subsegment in each specified decoding segment being operable to partially decode one of the input memory addresses while at least one other decoding subsegment in that specified decoding segment is simultaneously partially decoding one of the other input memory addresses.

8. A memory as in claim 7 wherein each decoding subsegment comprises:

an input storage element for storing a segment input address; and a decoder for performing a decoding operation on the segment input address to generate a segment output address, the decoding operation constituting a partial decoding of each input memory address processed through that decoding subsegment, the segment input address constituting an input memory address or a partially decoded version of an input memory address, the segment output signal constituting a decoded memory address or a partially decoded version of an input memory address.

9. A memory as in claim 7 further including input/output means for writing information into, and reading information out of, the memory array upon being sequentially addressed by the address means.

10. A memory of claim 7 wherein the sequentially supplied input memory addresses can have random values.

11. An electronic memory comprising:

a memory array for electronically storing information; and address means for sequentially addressing information storage locations in the memory array by decoding a multiplicity of sequentially supplied input memory addresses to generate a like multiplicity of respectively corresponding decoded memory addresses, each identifying one of the storage locations, the address means comprising a plurality of decoding segments arranged in parallel, each decoding segment sequentially decoding different ones of the input memory addresses from each other decoding segment, each decoding segment being operable to decode one of the input memory addresses while at least one other decoding segment is simultaneously decoding one of the other input memory addresses.

12. A memory as in claim 11 wherein each decoding segment comprises:

an input storage element for sequentially storing each input memory address supplied to that decoding segment; and a decoder for sequentially decoding each input memory address stored in the input storage element to generate the corresponding decoded memory address.

13. A memory as in claim 12 further including decode control means for providing decode control signals that cause the decoding segments to sequentially furnish the decoded memory addresses to the memory array.

14. A memory as in claim 13 wherein:

the decode control signals cause each input memory address supplied to each input storage element to be loaded into that input storage element at a different time than each input memory address supplied to each other input storage element is loaded into that other input storage element; and the decode control signals cause each decoded memory address generated by each decoder to be provided to the memory array at a different time than each decoded memory address generated by each other decoder is provided to the memory array.

15. A memory as in claim 13 further including input/output means for writing information into, and reading information out of, the memory array upon being sequentially addressed by the addressing means.

16. A memory as in claim 13 wherein the sequentially supplied input memory addresses can have random values.

17. An electronic memory comprising:

a plurality of memory arrays for electronically storing information, each memory array storing information identical to that stored in each other memory array; and address means for sequentially addressing information storage locations in the memory arrays by decoding a multiplicity of sequentially supplied input memory addresses to generate a like multiplicity of respectively corresponding decoded memory addresses, each identifying one storage location in each of the memory arrays, the address means comprising a like plurality of decoding segments arranged in parallel, each decoding segment sequentially decoding a different one of the input memory addresses from each other decoding segment to generate the decoded memory addresses for different corresponding ones of the memory arrays, each decoding segment being operable to decode one of the input memory addresses while at least one other decoding segment is simultaneously decoding one of the other input memory addresses.

18. A memory as in claim 17 wherein each decoding segment comprises:

an input storage element for sequentially storing each input memory address supplied to that decoding segment; and a decoder for sequentially decoding each input memory address stored in the input storage element to generate the corresponding decoded memory address.

19. A memory as in claim 18 further including control means for providing control signals that cause the decoding segments to sequentially furnish the decoded memory addresses to the memory arrays.

20. A memory as in claim 19 wherein the control signals cause each input memory address supplied to each input storage element to be loaded into that input storage element at a different time than each input memory address supplied to each other input storage element is loaded into that other input storage element.

21. A memory as in claim 18 further including output means for reading information out of the memory array upon being sequentially addressed by the address means.

22. A memory as in claim 18 wherein each memory array provides read data upon being addressed by that memory's decoding segment, the memory further including selection means for sequentially passing the read data of each of the memory arrays.

23. A memory as in claim 18 wherein the sequentially supplied input memory addresses can have random values.

24. A memory as in claim 17 wherein there are a like plurality of monolithic integrated circuits respectively corresponding to the memory arrays, each memory array and the decoder in the corresponding decoding segment being part of the corresponding integrated circuit.

* * * * *